(12) United States Patent
Fujii

(10) Patent No.: US 8,519,514 B2
(45) Date of Patent: Aug. 27, 2013

(54) SEMICONDUCTOR DEVICE AND MANUFACTURING METHOD THEREOF

(75) Inventor: Seiya Fujii, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 96 days.

(21) Appl. No.: 12/923,713

(22) Filed: Oct. 5, 2010

(65) Prior Publication Data
US 2011/0084400 A1 Apr. 14, 2011

(30) Foreign Application Priority Data

Oct. 9, 2009 (JP) ................................ 2009-235494
Jun. 3, 2010 (JP) ................................ 2010-128045

(51) Int. Cl.
*H01L 29/40* (2006.01)

(52) U.S. Cl.
USPC ........... 257/621; 257/774; 257/773; 257/777; 257/E23.011; 257/E21.597

(58) Field of Classification Search
USPC .......... 257/698, 774, 777, E23.011, E21.577, 257/E21.597, 621, 773
See application file for complete search history.

(56) References Cited

U.S. PATENT DOCUMENTS

| 5,399,898 | A  | * | 3/1995  | Rostoker         | 257/499 |
| 6,809,421 | B1 | * | 10/2004 | Hayasaka et al.  | 257/777 |
| 2002/0151169 | A1 | * | 10/2002 | Umetsu et al. | 438/629 |
| 2006/0170110 | A1 | * | 8/2006  | Akram et al.  | 257/774 |
| 2009/0243120 | A1 | * | 10/2009 | Kita et al.   | 257/774 |
| 2012/0248602 | A1 | * | 10/2012 | Takahashi et al. | 257/737 |

FOREIGN PATENT DOCUMENTS

JP 2000-150415 5/2000

* cited by examiner

*Primary Examiner* — Jasmine Clark
(74) *Attorney, Agent, or Firm* — McGinn IP Law Group, PLLC

(57) ABSTRACT

A semiconductor device includes a substrate, at least one via hole provided on the substrate, a through silicon via provided in the at least one via hole, and an interface chip that is electrically connected to the core chips through the through silicon via. The via hole includes a bowing shaped portion in which a diameter of a center portion is larger than diameters of both edges.

18 Claims, 23 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly relates to a semiconductor device including a plurality of core chips and an interface chip that controls the core chips and to a manufacturing method thereof.

2. Description of the Related Art

A memory capacity that is required in a semiconductor memory device such as a DRAM (Dynamic Random Access Memory) are increasing every year. To satisfy this requirement by increasing a memory capacity of each memory chip prevents to secure a yield rate because it requires finer processing than so far. Therefore, in recent years, a memory device that is called a multi-chip package where plural memory chips are laminated is suggested to satisfy the required memory capacity. However, since the memory chip used in the multi-chip package is a common memory chip capable of operating even though the memory chip is a single chip, a so-called front end unit that performs a function of an interface with an external device is included in each memory chip. For this reason, it is difficult to greatly increase a memory capacity for each chip.

In addition, a circuit that constitutes the front end unit is manufactured at the same time as a back end unit including a memory core, regardless of the circuit being a circuit of a logic system. Therefore there have been a further problem that it is difficult to speed up the front end unit.

As a method to resolve the above problem, a method that detaches the front end unit from each memory chips and integrate them in one interface chip and laminates these chips, thereby constituting one semiconductor memory device, is suggested. According to this method, with respect to memory chips (Hereafter, a memory chip whose front end unit was detached is called 'a core chip'.), it becomes possible to increase a memory capacity for each chip because an occupied area assignable for the memory core increases. Meanwhile, with respect to an interface chip that is integrated with the front end unit, it becomes possible to form its circuit with a high-speed transistor because the interface chip can be manufactured using a process different from that of the memory core. In addition, since the plural core chips can be allocated to one interface chip, it becomes possible to provide a semiconductor memory device that has a large memory capacity and a high operation speed as a whole.

The core chips and the interface chip are connected to each other with a through silicon via that is provided in a via hole that penetrates substrates of the core chips. Japanese Patent Application Laid-open No. 2000-150415 discloses a method of forming a via hole on a semiconductor substrate. With this method, it is possible to form a via hole having a side surface of a vertical shape (a side surface not having a bowing shape) on a semiconductor substrate. As disclosed in Japanese Patent Application Laid-open No. 2000-150415, conventionally, the side surface of the via hole is made to have a vertical shape, so that the via hole having a side surface of a bowing shape has never been manufactured.

However, in the semiconductor device including a plurality of core chips and an interface chip, when a side surface of a via hole in which a through silicon via is embedded is perpendicular to a surface of a substrate, there is a problem that the through silicon via falls out of the substrate particularly in an assembly process. That is, because the through silicon via is made of a conductive material such as copper (Cu) and tungsten (W), its adhesion to the semiconductor substrate is low. Furthermore, at the time of a solder connection in the assembly process, a load of several to several tens of newtons is applied on the through silicon via. For these reasons, the through silicon via sometimes falls out of the substrate, and an improvement for this problem has been required.

SUMMARY

In one embodiment, there is provided a semiconductor device comprising: a semiconductor substrate that includes at least one via hole penetrating the semiconductor substrate; and a through silicon via provided in the via hole, wherein the through silicon via includes a first section having a first end portion located close to one surface of the semiconductor substrate, a second end portion located close to other surface of the semiconductor substrate, and center portion located between the first and second portion, and the first and second end portions have different diameters from the center portion.

In another embodiment, there is provided a method of manufacturing a semiconductor device comprising: forming a mask pattern having an opening at a position where a through silicon via is to be formed in a planar view on one surface of the semiconductor substrate; forming a first section of a via hole that has a bowing shape in which a diameter of a center portion is larger than diameters of both end portions by etching the semiconductor substrate by using the mask pattern; and forming a through silicon via by depositing a conductive material such that the via hole is filled with the conductive material.

According to the present invention, because a bowing shaped portion is formed on a via hole, it is possible to prevent a through silicon via from falling out of a semiconductor substrate.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
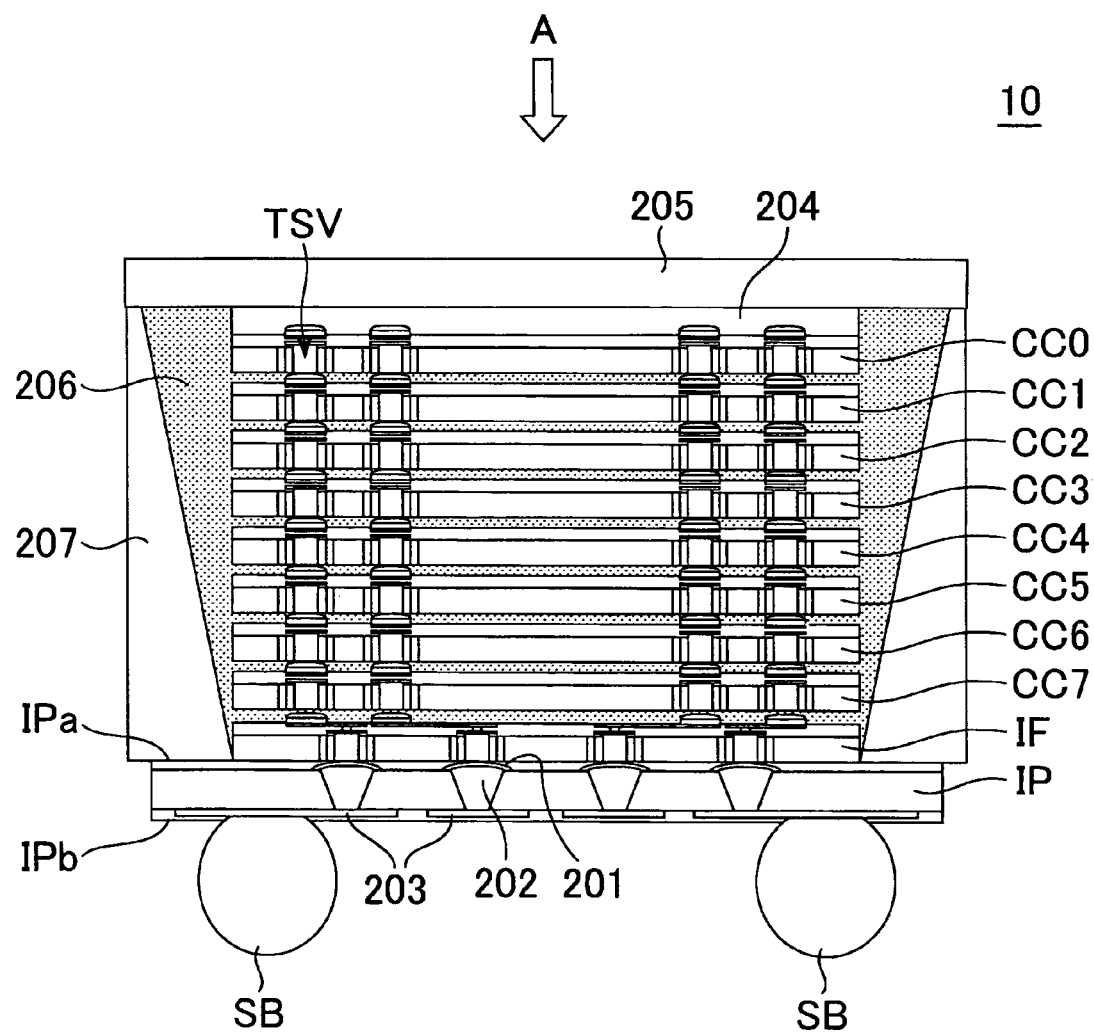
FIG. 1 is a schematic cross-sectional view provided to explain the structure of a semiconductor memory device according to the preferred embodiment of the present invention.

FIG. 1 is a schematic cross-sectional view provided to explain the structure of a semiconductor memory device 10 according to the preferred embodiment of the present invention.

As shown in FIG. 1, the semiconductor memory device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a semiconductor substrate (a silicon substrate) and are electrically connected to adjacent chips in a vertical direction through plural through silicon vias TSV penetrating the semiconductor substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes both of the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor memory device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF maybe disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor memory device 10. That is, an electrode 201 that is formed on a top surface IPa of the interposer IP is drawn to the back surface IPb via a through-hole electrode 202 and the pitch of the external terminals SB is enlarged by the rewiring layer 203 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 204 and a lead frame 205. Gaps between the core chips CC0 to CC7 and the interface chip IF are filled with an underfill 206 and surrounding portions of the gaps are covered by a sealing resin 207. Thereby, the individual chips are physically protected.

Figure 2A:
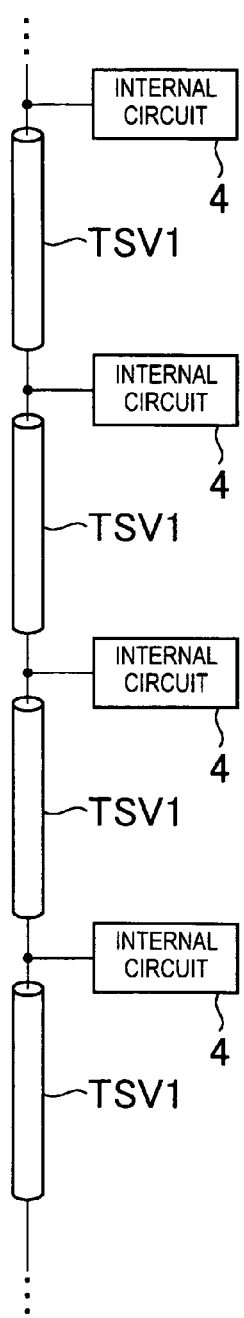
FIGS. 2A to 2C are diagrams showing the various types of through silicon vias provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plan view are short-circuited, and one wiring line is configured by the through silicon vias TSV1. The through silicon vias TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the TSV1 are wired-ORed and input to the interface chip IF.

Figure 2B:
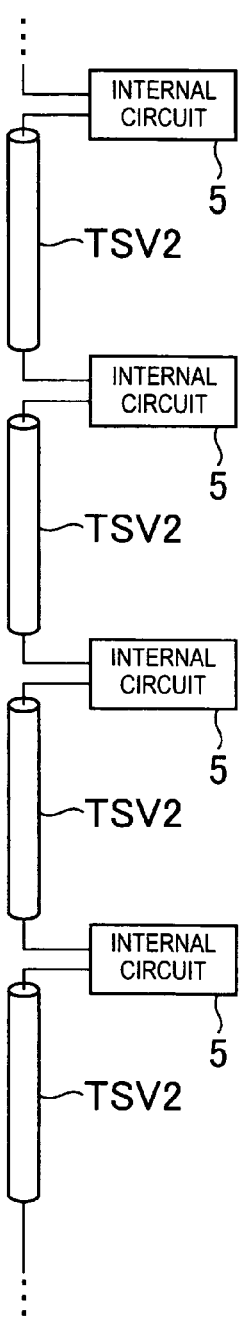

Meanwhile, as shown in FIG. 2B, the a part of through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits that are provided in the core chips CC0 to CC7 are cascade-connected through the through silicon vias TSV2. This kind of through silicon vias TSV2 is used to sequentially transmit predetermined information to the internal circuits 5 provided in the core chips CC0 to CC7. As this information, layer address information to be described below is exemplified.

Figure 2C:
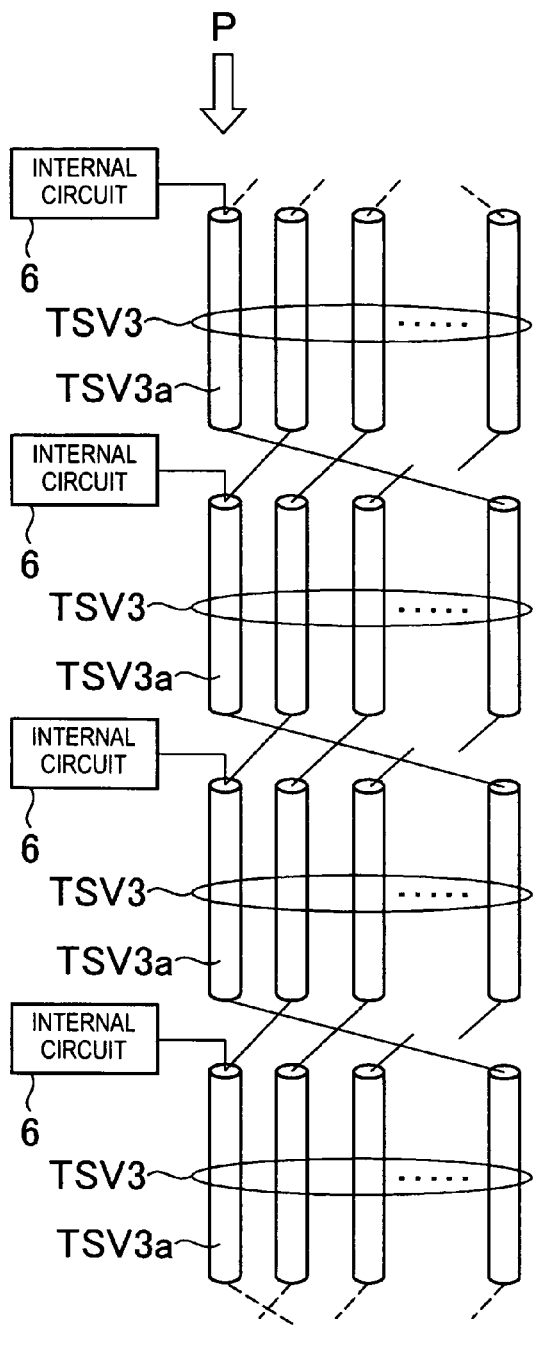

Another through silicon via TSV group is short-circuited from the through silicon via TSVs of other layer provided at the different position in plan view, as shown in FIG. 2C. With respect to this kind of through silicon via TSV group 3, internal circuits 6 of the core chips CC0 to CC7 are connected to the TSV3a provided at the predetermined position P in plan view. Thereby, information can be selectively input to the internal circuits provided in each of the core chips. As this information, defective chip information is exemplified. Details of this example is described later.

As such, as types of the through silicon vias TSV provided in the core chips CC0 to CC7, three types (TSV1 to TSV3) shown in FIGS. 2A to 2C exist. As described above, most of the through silicon vias TSV are of a type shown in FIG. 2A, and an address signal, a command signal, and a clock signal are supplied from the interface chip IF to the core chips CC0 to CC7, through the through silicon vias TSV1 of the type shown in FIG. 2A. Read data and write data are also input to and output from the interface chip IF through the through silicon vias TSV1 of the type shown in FIG. 2A. Meanwhile, the through silicon vias TSV2 and through silicon vias TSV3 of the types shown in FIGS. 2B and 2C are used to provide individual information to the core chips CC0 to CC7 having the same structure.

Figure 3:
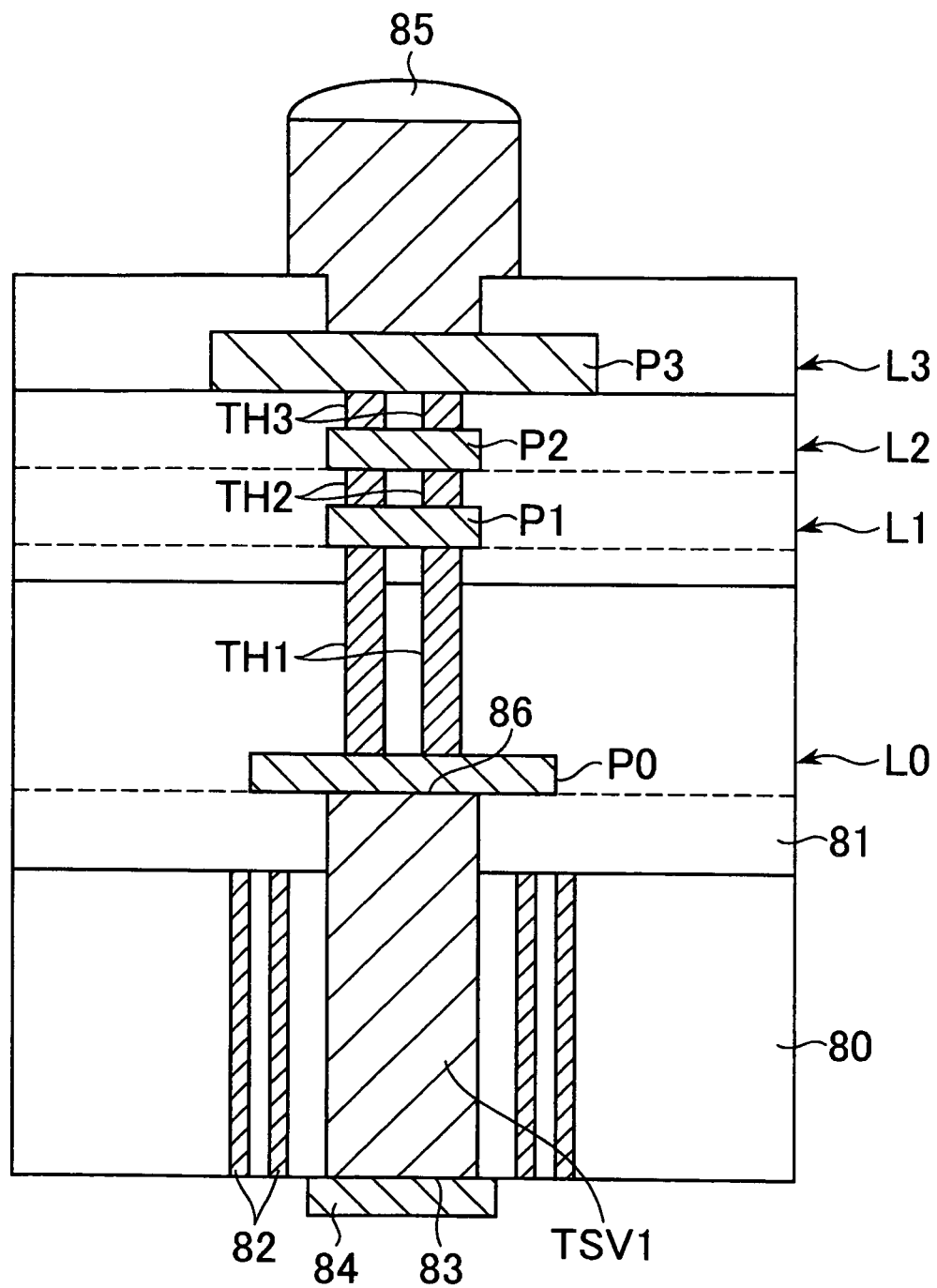
FIG. 3 is a cross-sectional view illustrating the structure of the through silicon via of the type shown in FIG. 2A.

FIG. 3 is a cross-sectional view illustrating the structure of the through silicon via TSV1 of the type shown in FIG. 2A.

As shown in FIG. 3, the through silicon via TSV1 is provided to penetrate a semiconductor substrate 80 and an interlayer insulating film 81 provided on a surface of the semiconductor substrate 80. Around the through silicon via TSV1, an insulating ring 82 is provided. Thereby, the through silicon via TSV1 and a transistor region are insulated from each other. In an example shown in FIG. 3, the insulating ring 82 is provided double. Thereby, capacitance between the through silicon via TSV1 and the semiconductor substrate 80 is reduced.

An end 83 of the through silicon via TSV1 at the back surface of the semiconductor substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plan view are short-circuited. Connection with internal circuits (not shown in the drawings) is performed through internal wiring lines (not shown in the drawings) drawn from the pads P0 to P3 provided in the wiring layers L0 to L3.

A configuration for preventing the through silicon via TSV from falling out of the semiconductor substrate 80 of each of the core chips is explained below in detail.

Figure 4:
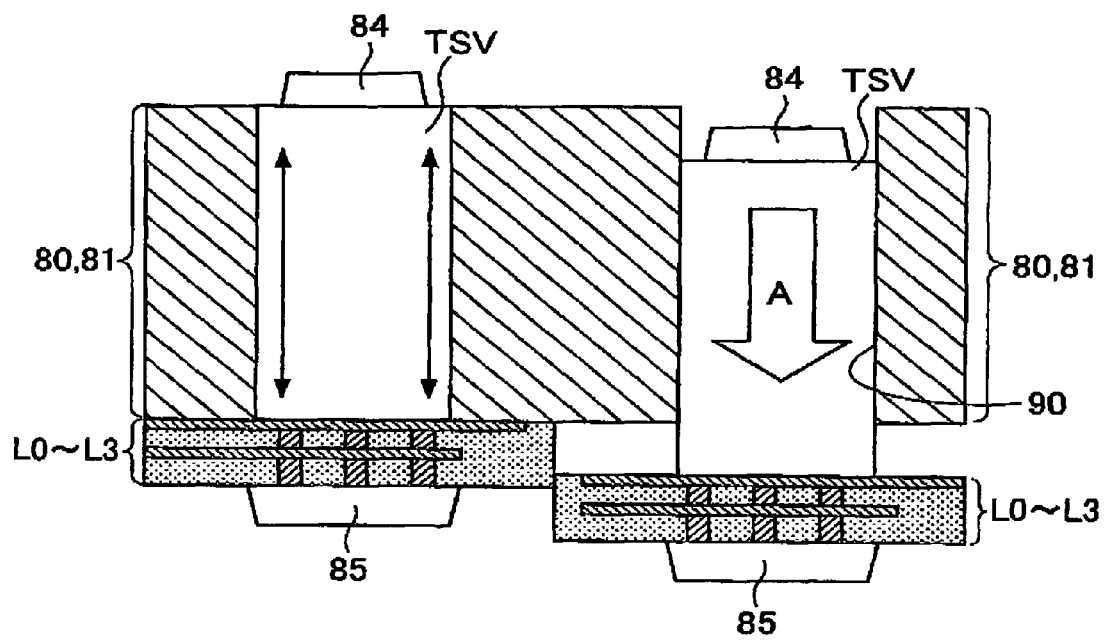
FIG. 4 is a schematic cross section showing a structure of the through silicon via TSV according to a background technique of the present invention.

FIG. 4 is a schematic cross section showing a structure of the through silicon via TSV according to a background technique of the present invention. FIG. 4 is a diagram obtained by schematically drawing FIG. 3, and like reference numerals as those in FIG. 3 are used. As shown in FIG. 4, in the background technique, a side surface of a via hole 90 for embedding the through silicon via TSV is perpendicular to a surface of the semiconductor substrate 80. Furthermore, the through silicon via TSV is made of a conductive material such as Cu or W, so that its adhesion to the semiconductor substrate 80 is low. Therefore, due to a load applied when performing a solder connection in an assembly process, the through silicon via TSV sometimes falls off in a direction A shown in FIG. 4. As a result, as shown in FIG. 4, the wiring layers L0 to L3 become raptured.

Figure 5:
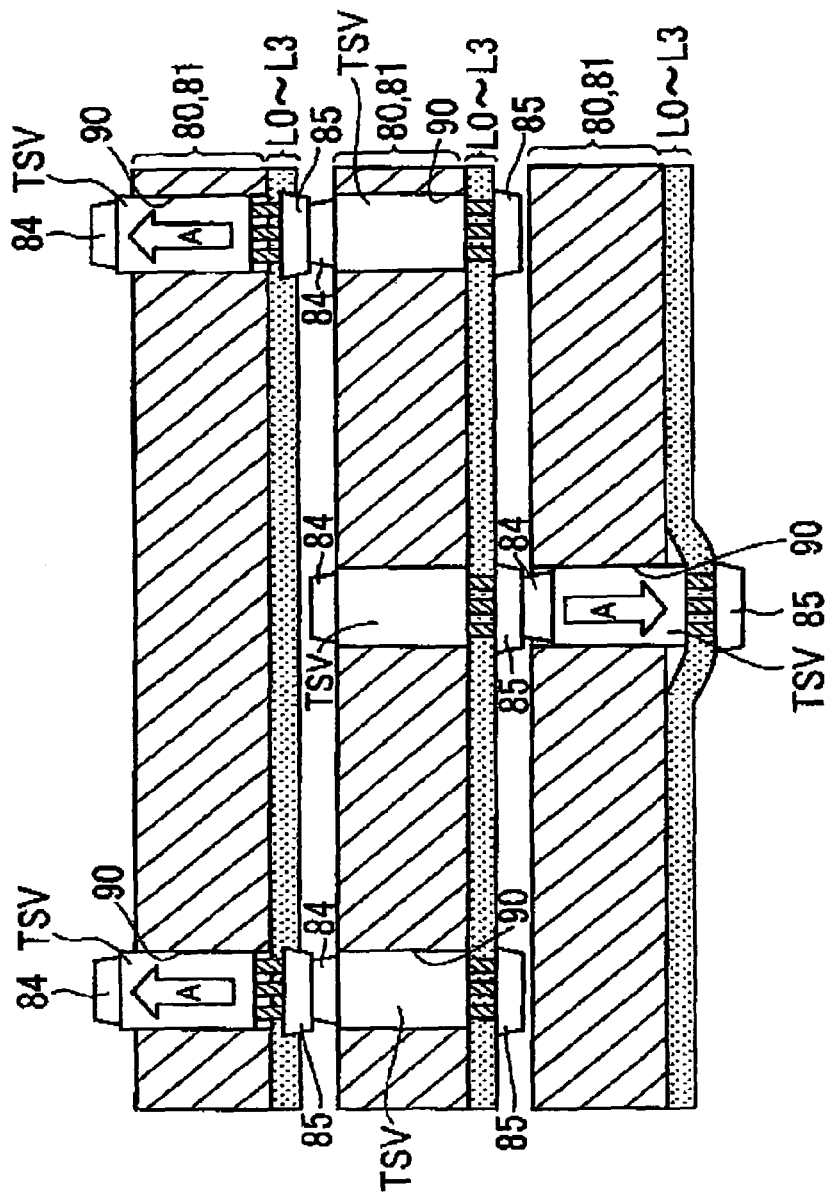
FIG. 5 is a schematic cross section showing another structure of the through silicon via TSV according to the background technique of the present invention.

FIG. 5 is a schematic cross section showing another structure of the through silicon via TSV according to the background technique of the present invention. FIG. 5 is an example of the through silicon vias TSV in a structure of three layer core chips. As shown in FIG. 5, even with a group of a series of the through silicon vias TSV that do not penetrate from the top to the bottom of the three layer core chips in the vertical direction, a part of the through silicon vias TSV sometimes falls off due to a concentration of the load at the time of the solder connection.

Figure 6:
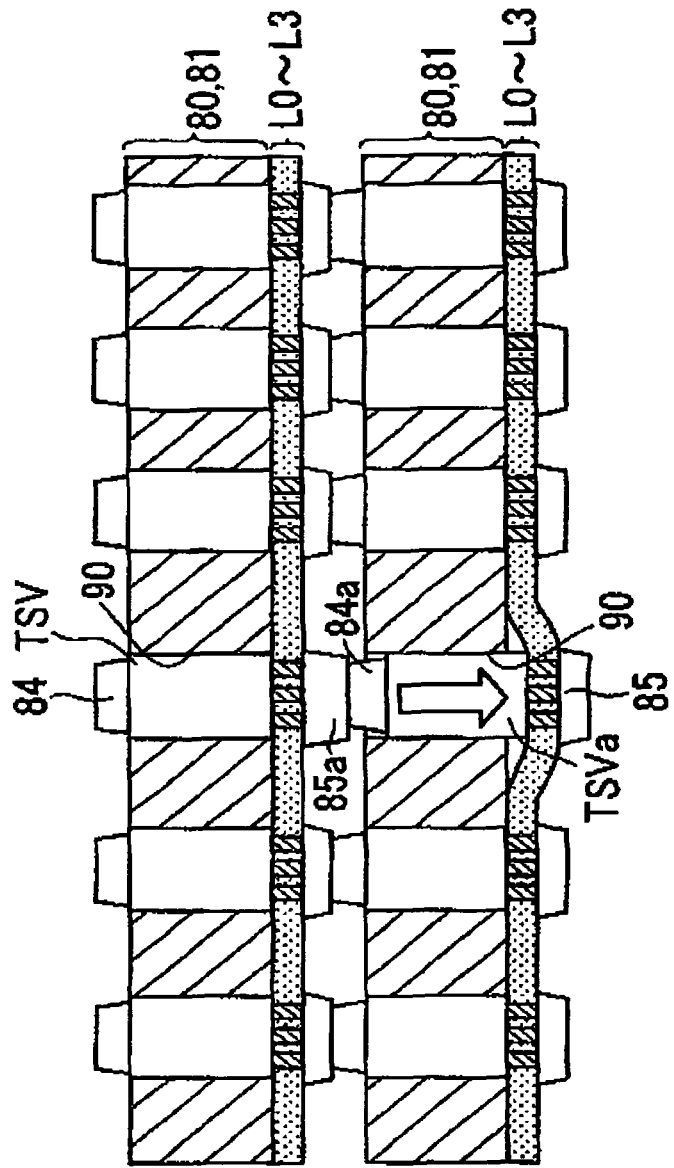
FIG. 6 is a schematic cross section showing still another structure of the through silicon via TSV according to the background technique of the present invention.

FIG. 6 is a schematic cross section showing still another structure of the through silicon via TSV according to the background technique of the present invention. FIG. 6 is an example of the through silicon vias TSV in a structure of two layer core chips, in which only a back side bump 84a and a front side bump 85a among back side bumps 84 and front side bumps 85 respectively provided for the through silicon vias TSV are formed larger than the others. This causes the load to be concentrated on a through silicon via TSVa, leading to the through silicon via TSVa falling off.

Figure 7:
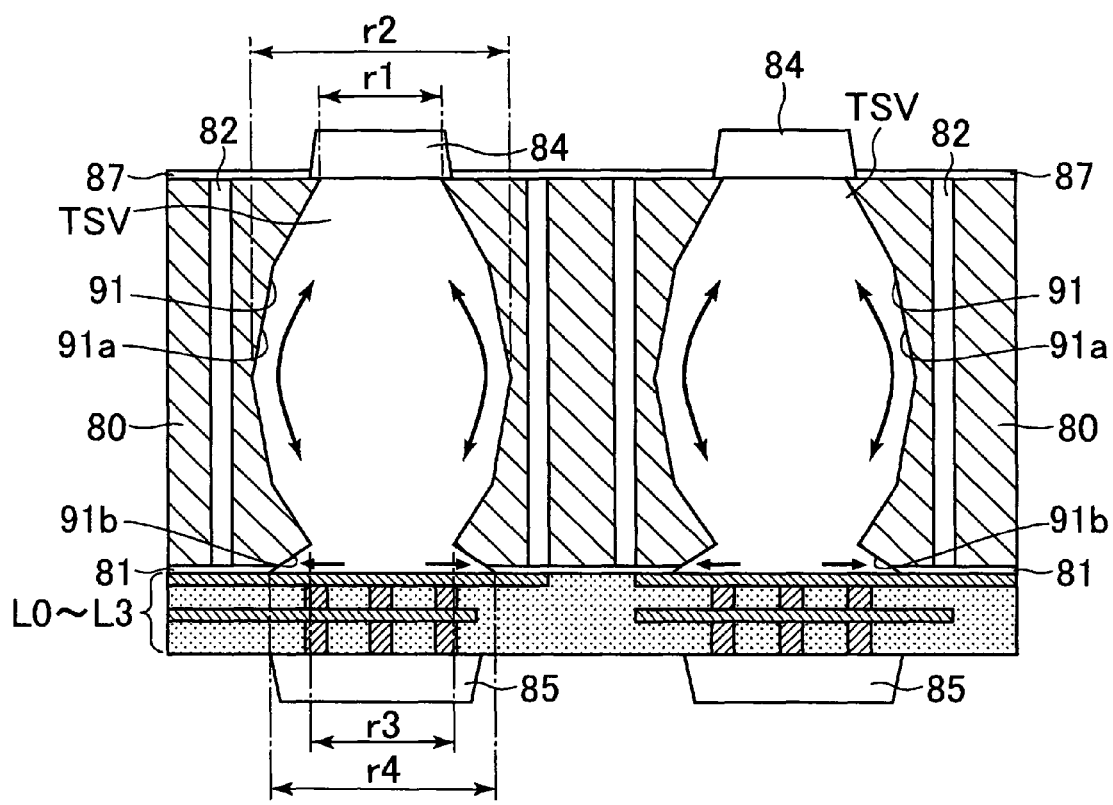
FIG. 7 is a schematic diagram showing a portion of a cross section of the semiconductor device according to the present embodiment, including cross sections of two through silicon vias arranged adjacent to each other on the same core chip.

FIG. 7 is a schematic diagram showing a portion of a cross section of the semiconductor device 10 according to the present embodiment, including cross sections of two through silicon vias TSV arranged adjacent to each other on the same core chip. As shown in FIG. 7, a via hole 91 in which the through silicon via TSV according to the present embodiment are provided has a bowing shaped portion 91a. The side surface of the bowing shaped portion 91a is curved outward and a diameter r2 at the center portion of the bowing shaped portion 91a is larger than diameters r1 and r3 at its both edges. In other words, the bowing shape is shaped like a beer barrel with the center portion bulging outward. Thereby through silicon vias TSV includes a first portion provided in the bowing shaped portion 91a. The first portion includes a first end part having diameter r3, a second end part having diameter r1, and a center part sandwiched between the first and second end parts having diameter r2.

An opening diameter r4 of the via hole 91 corresponding to a lower edge portion of the through silicon via TSV is formed larger than the diameter r3 of a lower edge of the bowing shaped portion 91a. That is, a portion lower than the lower edge of the bowing shaped portion 91a forms a notch 91b that is formed by hollowing the inner surface of the via hole 91 outward. By forming the notch 91b, the lower edge of the bowing shaped portion 91a protrudes inside the via hole 91. Thereby through silicon vias TSV further includes a second portion provided in the notch 91b. The second portion includes a third end part exposed from the surface of the semiconductor substrate 80 and a fourth end part connected to the first end part having diameter r3.

Ratios between the diameters can be taken as, for example, r1=r3, (r2/r1)×100=105%, and (r4/r3)×100=103%. However, the ratios between the diameters according to the present invention are not limited thereto. The larger the values of (r2/r1)×100 and (r4/r3)×100 are, the more effect can be obtained. However, when bulging of the bowing shape (the ratio between r2 and r1) and the notch 91b (the ratio between r4 and r3) are made too large, a space may be created between the via hole 91 and a conductive material when embedding the conductive material in the via hole 91. Therefore, it is preferable that the values of (r2/r1)×100 and (r4/r3)×100 are smaller than 150%.

As the via hole 91 has the above structure, the through silicon via TSV embedded in the via hole 91 is hard to fall out of the semiconductor substrate 80, as compared to the conventional case. Therefore, the through silicon via TSV is prevented from falling out of the semiconductor substrate 80 as is the case shown in FIGS. 4 to 6.

Figure 8:
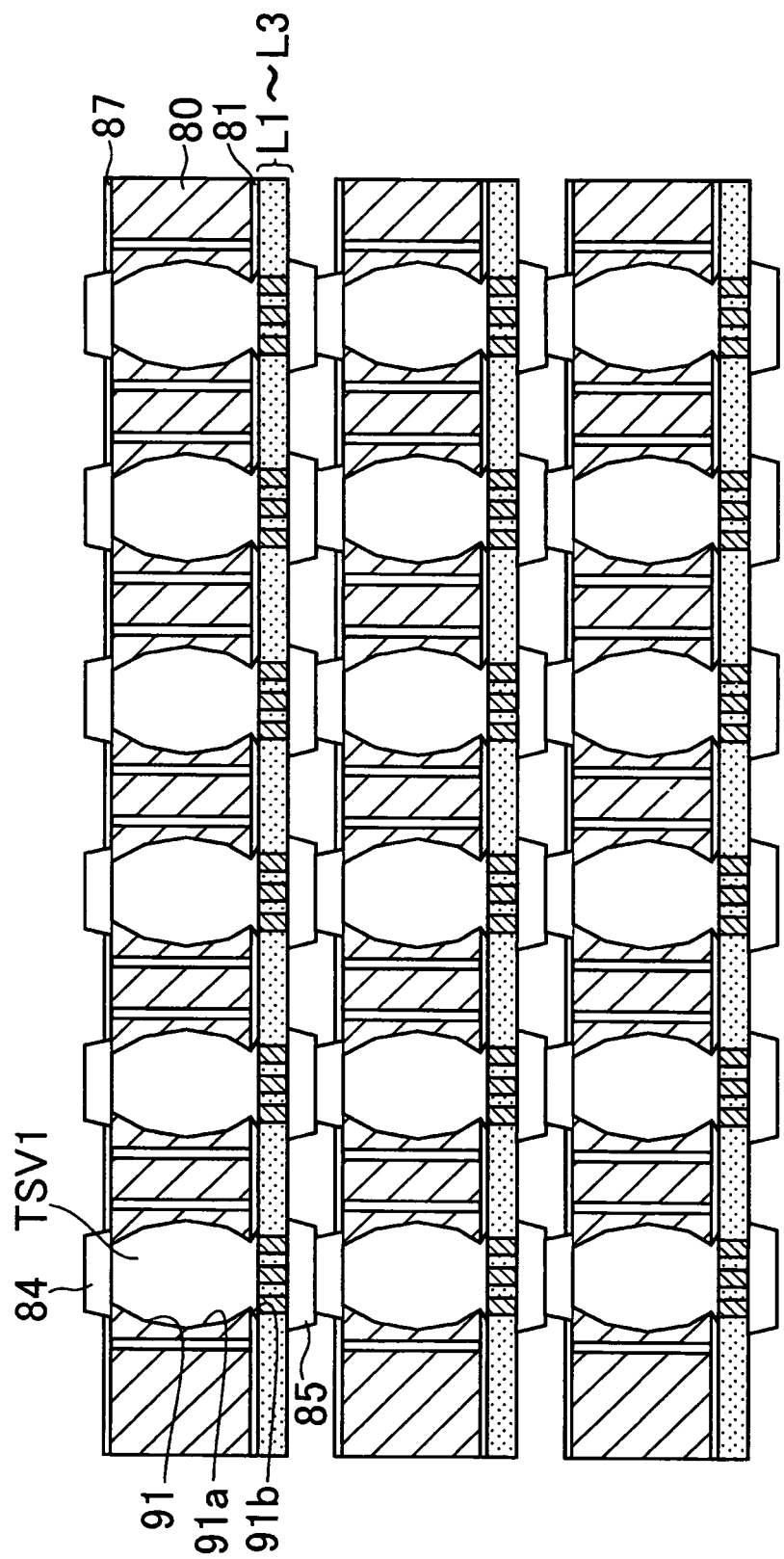
FIG. 8 is a schematic cross section of a larger portion of the semiconductor device according to the present embodiment.

FIG. 8 is a schematic cross section of a larger portion of the semiconductor device 10 according to the present embodiment. FIG. 8 shows three layers of the core chips and the through silicon vias TSV1 (the through silicon vias TSV of the type shown in FIG. 2A) provided on each of the core chips. Although it is preferable to provide the bowing shaped portion 91a and the notch 91b shown in FIG. 7 to all the through silicon vias TSV1 in each layer as shown in FIG. 8, not all the through silicon vias TSV1 have to have the bowing shaped portion 91a and the notch 91b. It suffices that at least the through silicon vias TSV1 on which the load is particularly applied at the time of the solder connection have the bowing shaped portion 91a and the notch 91b. Although the through silicon vias TSV1 are only shown in FIG. 8, it is needless to mention that it is preferable to provide the bowing shaped portion 91a and the notch 91b to the through silicon vias TSV2 of the type shown in FIG. 2B and the through silicon vias TSV3 of the type shown in FIG. 2C.

A method of manufacturing the semiconductor device 10 including the through silicon vias TSV shown in FIG. 7 (only a part pertaining to the manufacture of the through silicon vias TSV) is explained below.

FIGS. 9 to 18 are process diagrams for explaining the method of manufacturing the semiconductor device 10. Each of FIGS. 9 to 18 shows a schematic cross section of the semiconductor device 10 corresponding to FIG. 7.

Figure 9:
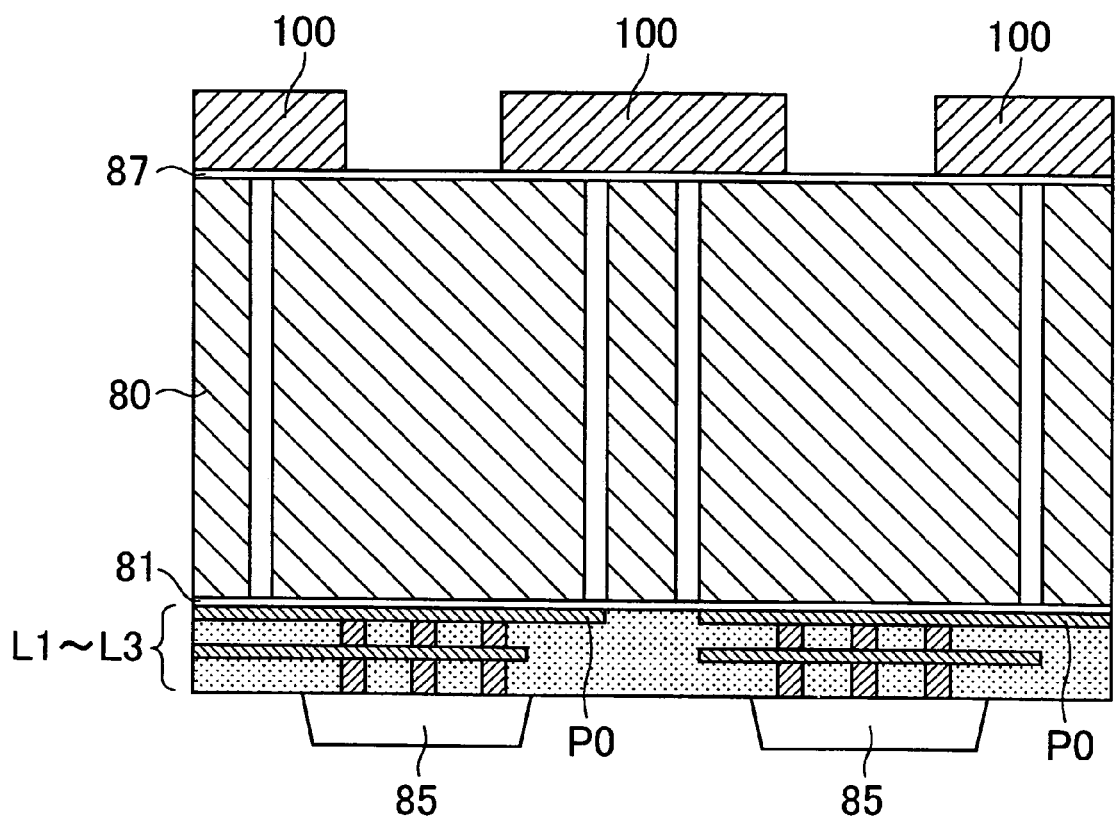
FIGS. 9 to 18 are process diagrams for explaining the method of manufacturing the semiconductor device according to the present embodiment.

First, the semiconductor device 10 is manufactured up to the state shown in FIG. 9. That is, an inter-layer insulating film 81 is formed on a surface (a surface located at the bottom in FIG. 9) of the semiconductor substrate 80 on which a transistor and the like are formed, and the wiring layers L0 to L3 and the bump 85 are formed on a surface of the inter-layer insulating film 81. Although the pads P0 to P3 and the through hole electrodes TH1 to TH3, a transistor, a capacitor and the like are formed in the wiring layers L0 to L3, detailed explanations on these parts will be omitted. Furthermore, because the transistor and the capacitor are provided at different positions from the through silicon vias TSV in a planar view, they are not shown in the drawings. Subsequently, the semiconductor substrate 80 is turned upside down, and an inter-layer insulating film 87 is formed on its surface (a surface located at the top in FIG. 9). After a resist is applied on the inter-layer insulating film 87, the semiconductor substrate 80 is exposed, thus forming a mask pattern 100 (a mask pattern having openings at positions where the through silicon vias TSV are to be formed in a planar view) for forming the through silicon vias TSV.

Figure 10:
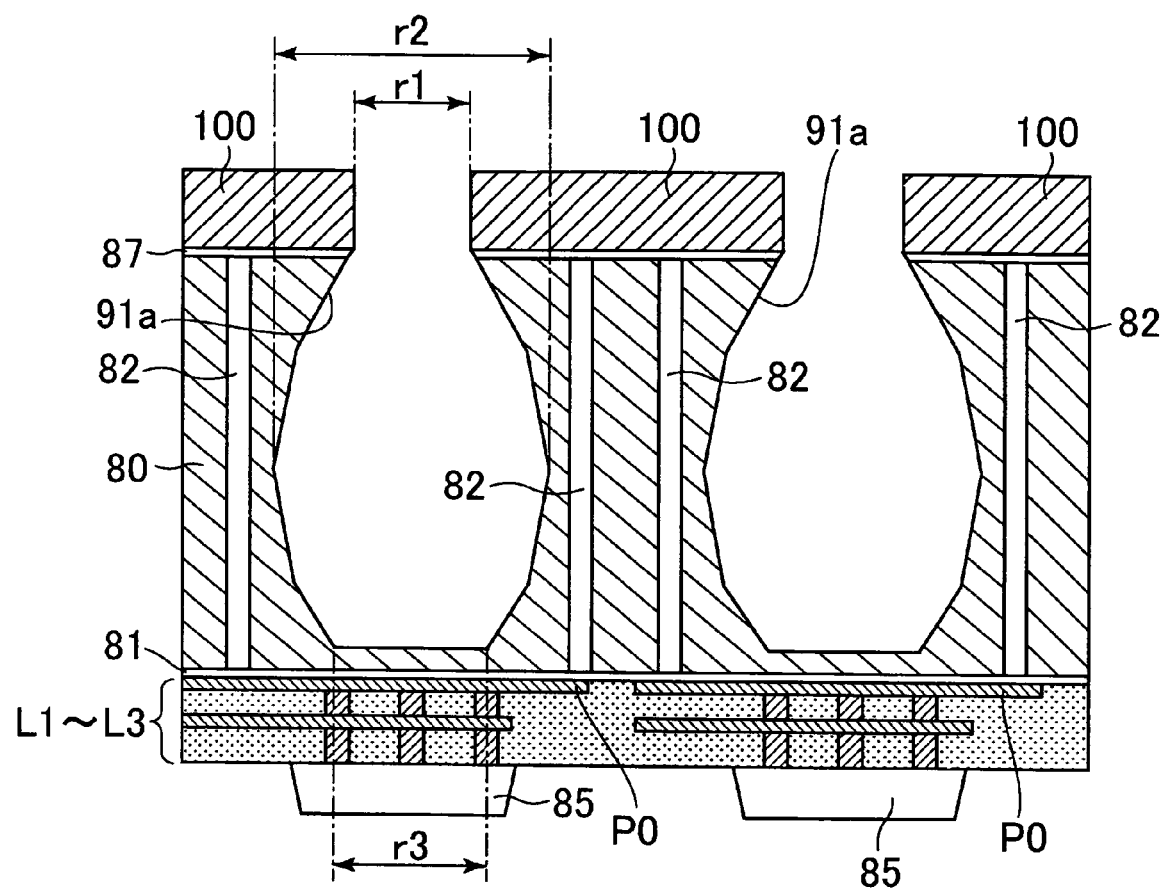

Thereafter, as shown in FIG. 10, the bowing shaped portion 91a (a first via hole) is formed by dry etching. An etching condition is, for example, $SF_6$ (sulfur hexafluoride) or $C_4F_8$ (octafluorocyclobutane) is used as an etching gas with a bias power of 300 W (watts). An etching time is controlled such that the inter-layer insulating film 81 is not exposed. The bowing shape with the diameter r2 at the center portion larger than the diameters r1 and r3 at both edges is obtained by reducing a deposition amount of a reaction product which is produced at the time of the etching to a side wall of the middle part of the first via hole so that the etching is expedited at the side wall. An etching rate can be enhanced by using a gas having a high etching effect, such as the $SF_6$ gas.

Figure 11:
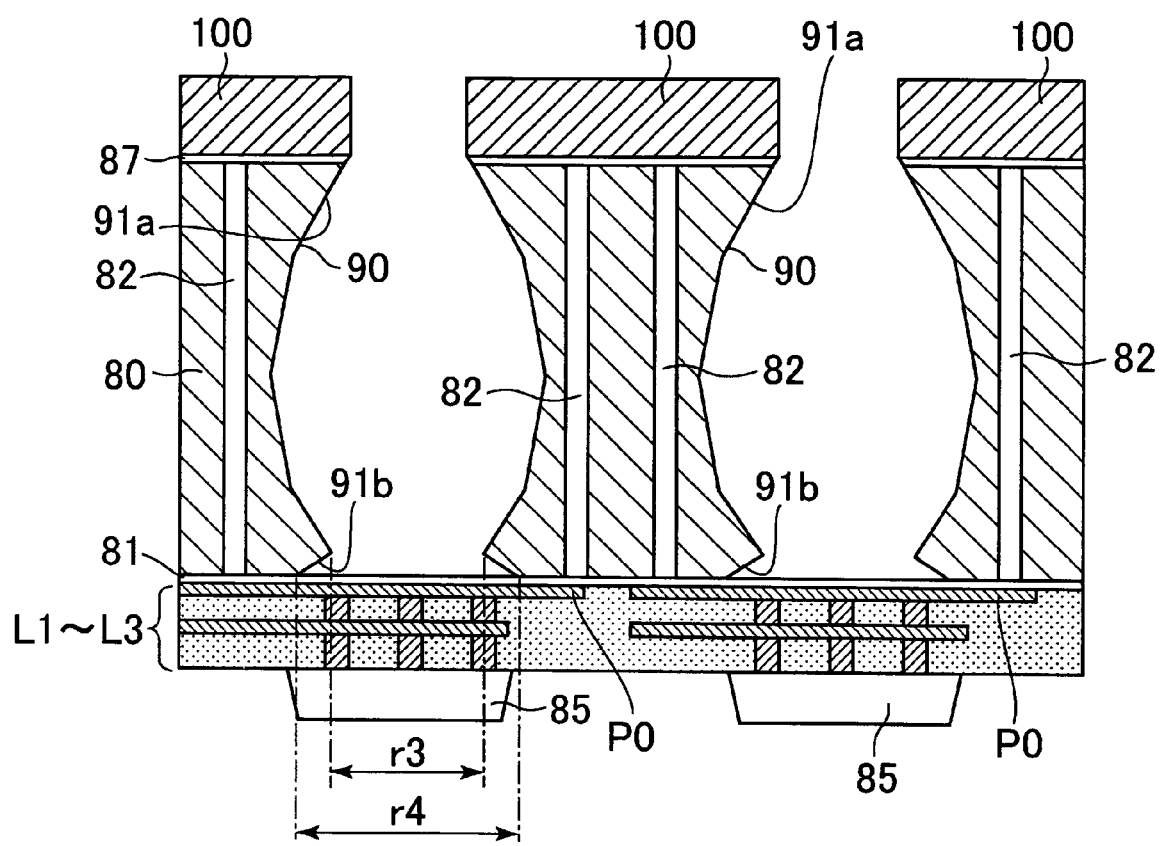

Next, the bias power is lowered to 100 W, and the etching is further progressed. At this stage of etching, the etching is further progressed even after the inter-layer insulating film 81 is exposed, which makes an over-etching state. The bias power is lowered to enhance a selectivity of the etching with respect to the inter-layer insulating film 81 thereby using the inter-layer insulating film 81 as a stopper, so that side etching of the semiconductor substrate 80 is progressed near a surface boundary with the inter-layer insulating film 81 while the inter-layer insulating film 81 is not virtually etched. As a result, as shown in FIG. 11, the notch 91b (a second via hole) is formed such that the diameter r4 at an opposite edge a connection edge with the inter-layer insulating film 81) is larger than the diameter r3 at a connection edge with the bowing shaped portion 91a. By this etching process, a fluctuation of a thickness of the semiconductor substrate 80 or a fluctuation of the etching rate in a plane of the dry etching is absorbed.

Figure 12:
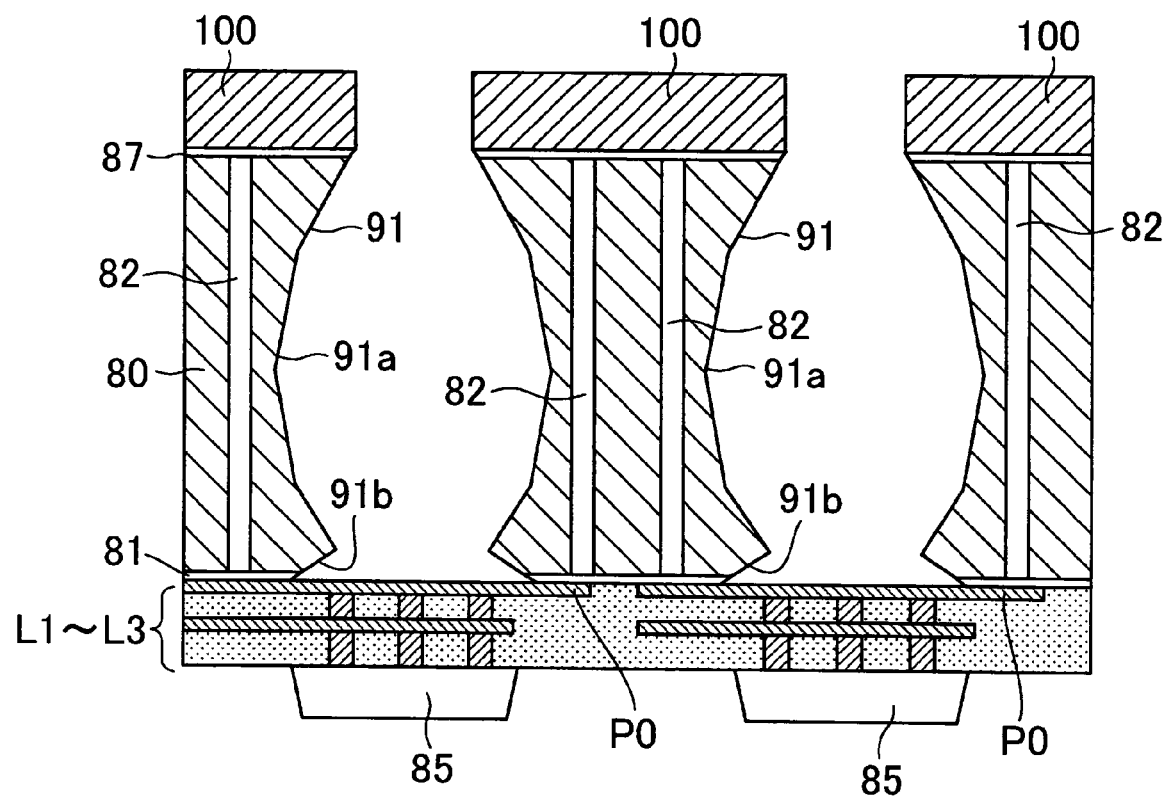

Next, the etching gas is changed to a $CF_4$ (tetrafluoromethane) gas and the bias power is raised to 300 W or higher (for example, 1000 W) to further perform the etching. By this etching process, as shown in FIG. 12, the inter-layer insulating film 81 that is exposed on the bottom of the notch 91b is etched, so that a surface of the pad P0 formed in the wiring layer L0 is exposed. At this time, it is possible to prevent damage due to the etching by reducing an amount of the $CF_4$ gas just before the pad P0 is exposed, thus enhancing a selectivity of the etching with respect to the pad P0.

Figure 13:
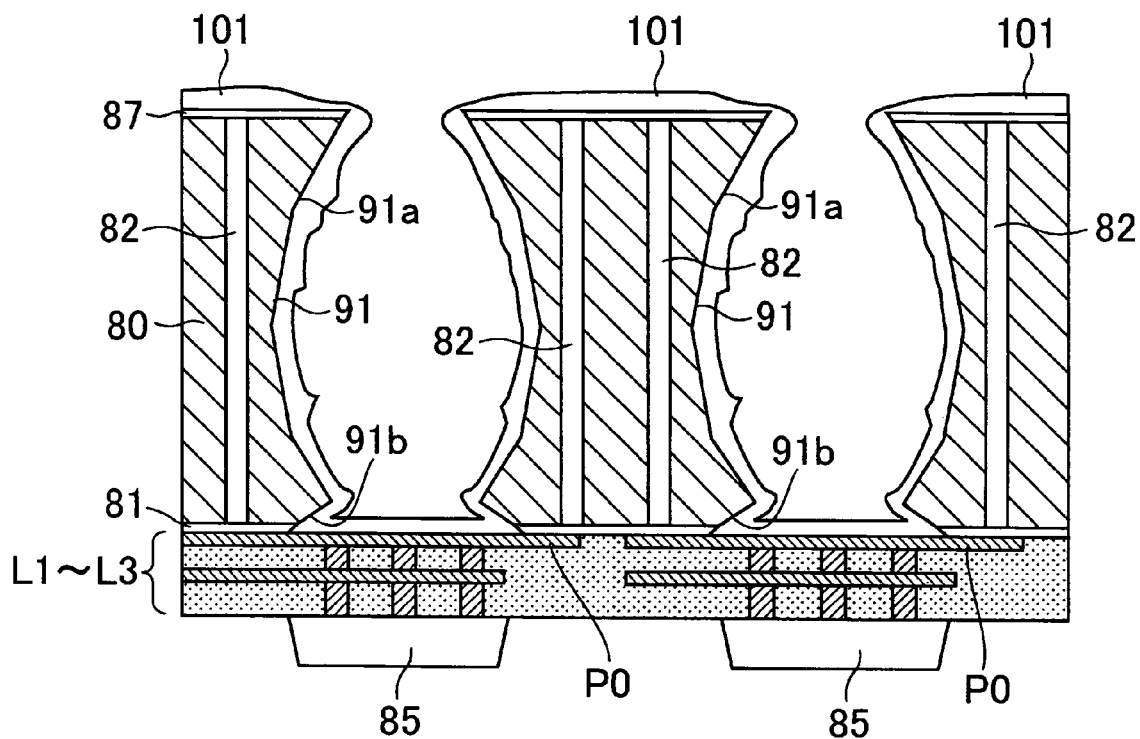

Subsequently, the mask pattern 100 is removed, and as shown in FIG. 13, a thin seed layer 101 is formed on an inner wall and an upper surface of the via hole 91 by depositing copper using a sputter that employs an RF and a bias power. By using the sputter that employs the RF and the bias power, it is possible to deposit the seed layer 101 even on the inner wall of the via hole 91 with a good coverage.

Figure 14:
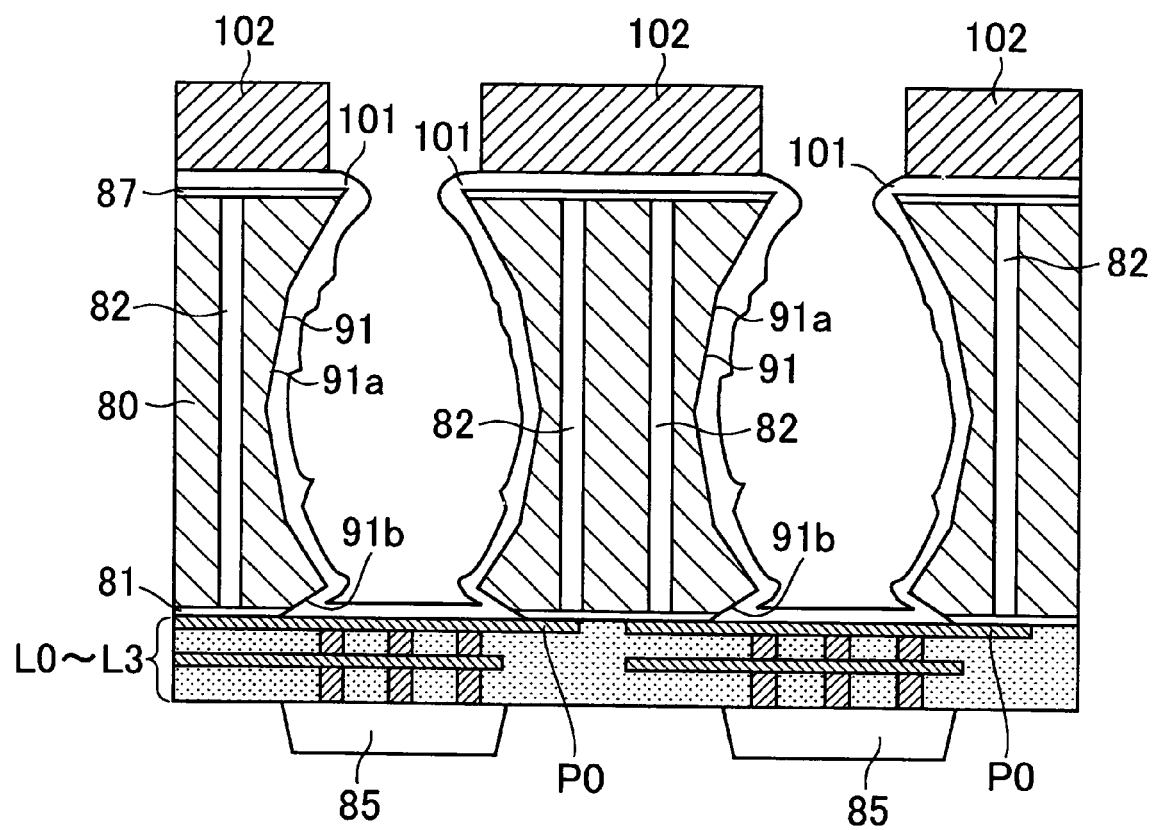

Thereafter, by applying a resist on the top surface and exposing it, a mask pattern 102 with a hole at a position where the through silicon via TSV is to be formed in a planar view is formed, as shown in FIG. 14.

Figure 15:
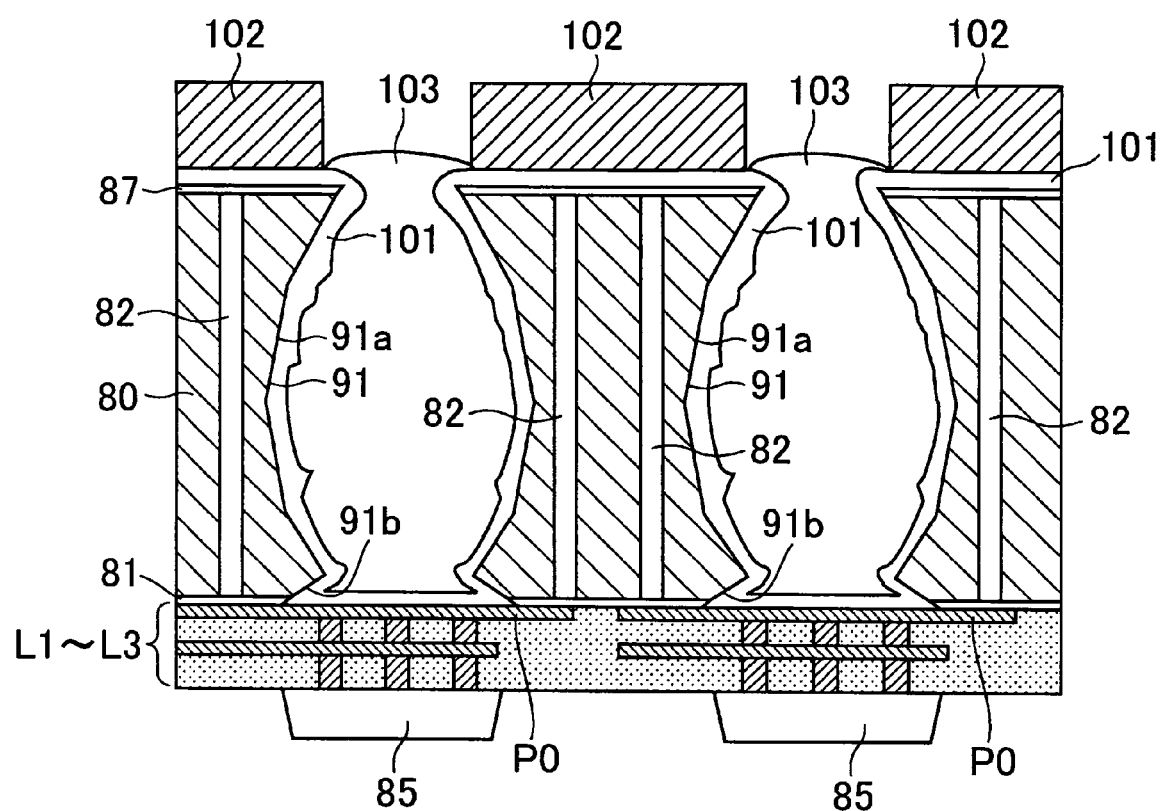
Figure 16:
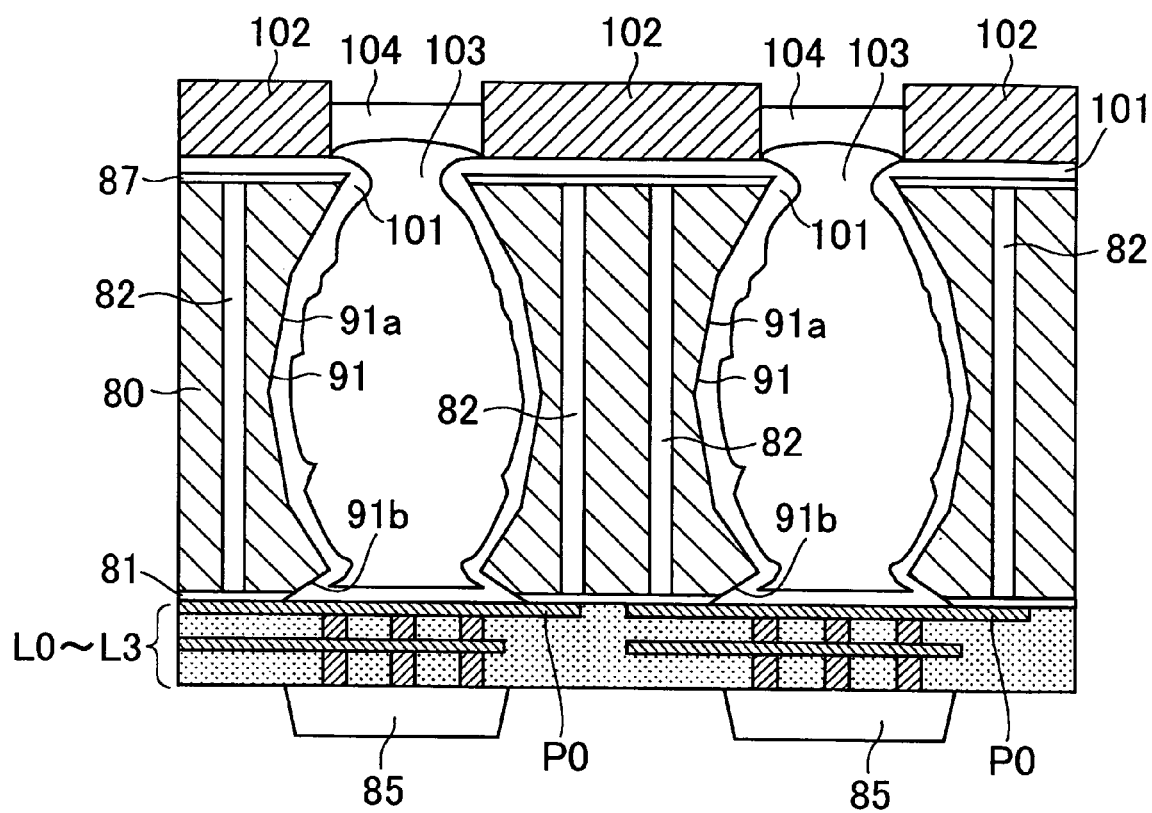
Figure 17:
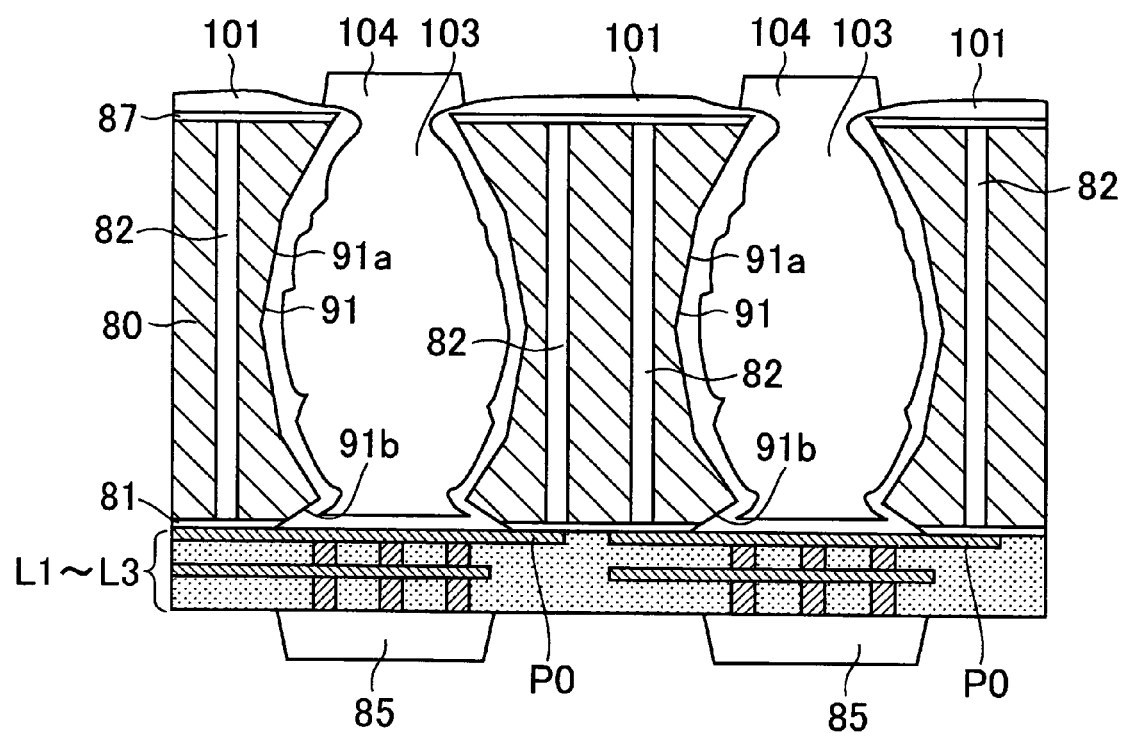

Subsequently, a conductive material 103 such as copper is deposited by an electroplating, and as shown in FIG. 15, the via hole 91 is filled in with the conductive material 103. Furthermore, an alloy of nickel and aluminum is deposited by the electroplating, and as shown in FIG. 16, a bump 104 is formed on the via hole 91. Thereafter, as shown in FIG. 17, the mask pattern 102 is removed.

Figure 18:
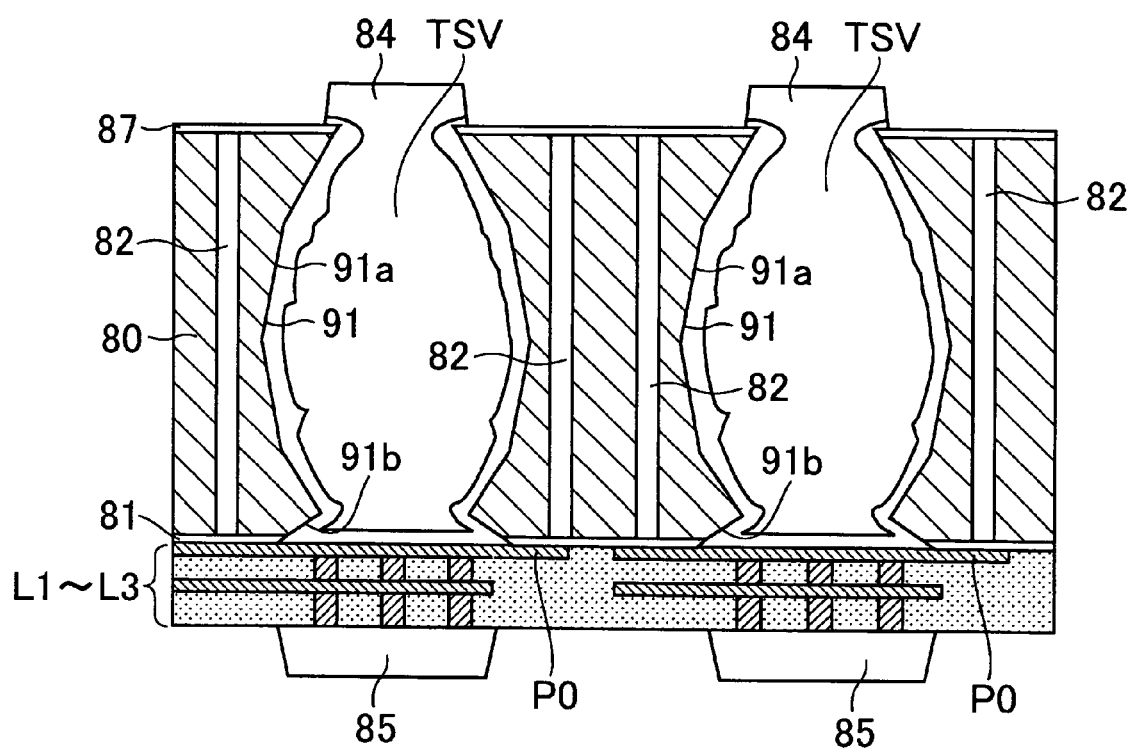

Next, by etching the copper using the bump 104 as a mask, as shown in FIG. 18, the seed layer on the top surface is removed. With this process, the through silicon via TSV and the bump 84 shown in FIG. 7 are completed.

As explained above, with the present manufacturing method, the semiconductor device 10 can be manufactured, which includes the through silicon via TSV including the bowing shaped portion 91a and the notch 91b.

Figure 19:
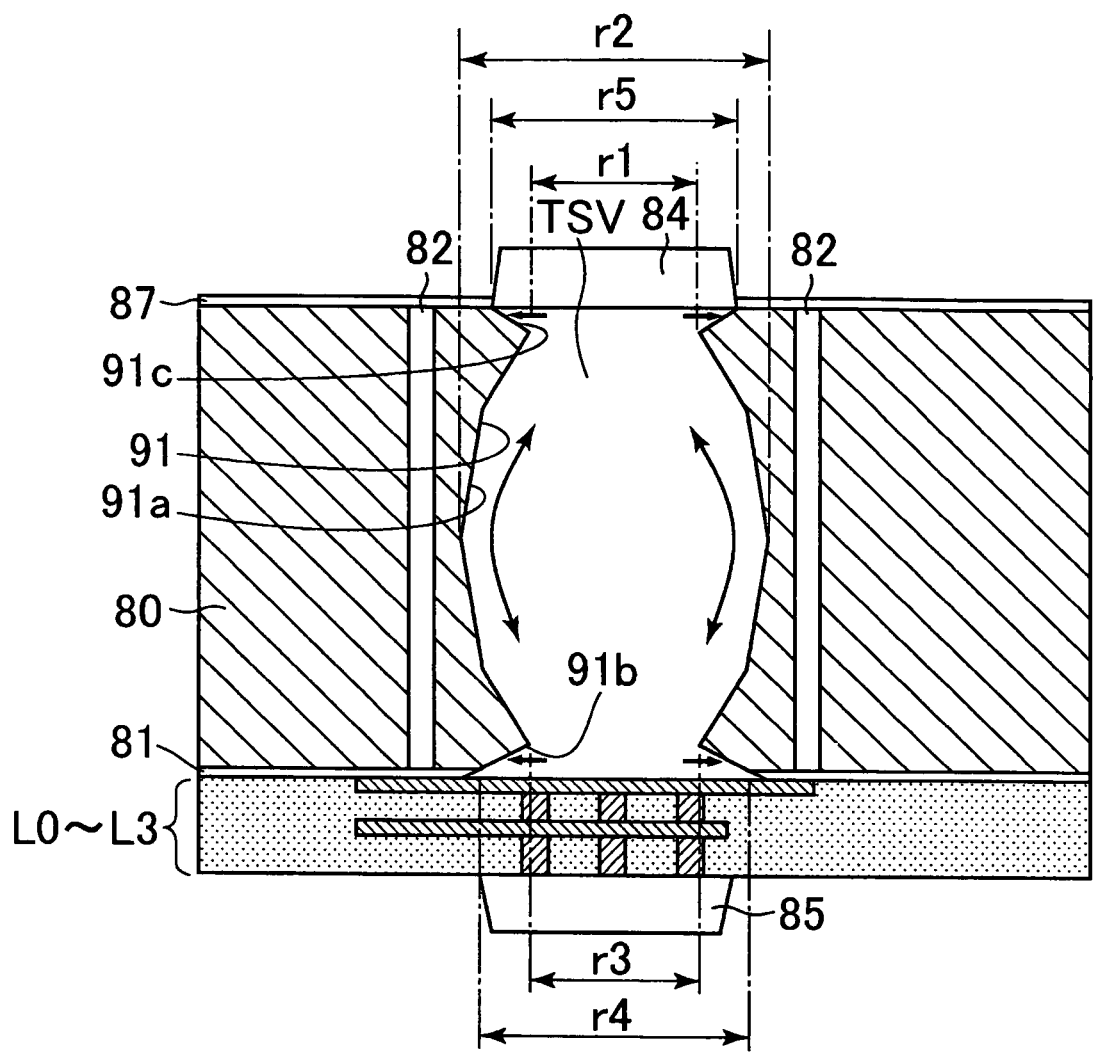
FIG. 19 is a schematic cross section of a portion of the semiconductor device according to a modification of the present embodiment, including a cross section of one through silicon via.

FIG. 19 is a schematic cross section of a portion of the semiconductor device 10 according to a modification of the present embodiment, including a cross section of one through silicon via TSV. As shown in FIG. 19, the via hole 91 in which the through silicon via TSV according to the modification is provided includes a notch 91c at the upper edge, as well as the notch 91b formed at the lower edge of the through silicon via TSV. A diameter r5 of an opening edge of the via hole 91, which corresponds to the upper edge of the through silicon via TSV, is larger than the diameter r1 of the upper edge of the bowing shaped portion 91a. Thereby through silicon vias TSV further includes a third portion provided in the notch 91c. The third portion includes a fifth end part exposed from the surface of the semiconductor substrate 80 and a sixth end part connected to the second end part having diameter r1.

A ratio between the diameter r5 and the diameter r1 can be taken as (r5/r1)×100=107%, for example. The ratios between the other diameters are the same as those in the above embodiment. However, the ratios between the diameters according to the present invention are not limited to these values.

With the via hole 91 having the above structure, the through silicon via TSV according to the present modification has more effect of preventing the through silicon via TSV from falling out of the semiconductor substrate 80, as compared to the through silicon via TSV shown in FIG. 7.

A method of manufacturing the semiconductor device 10 including the through silicon via TSV shown in FIG. 19 (only a part pertaining to the manufacture of the through silicon vias TSV) is explained below.

Figure 20:
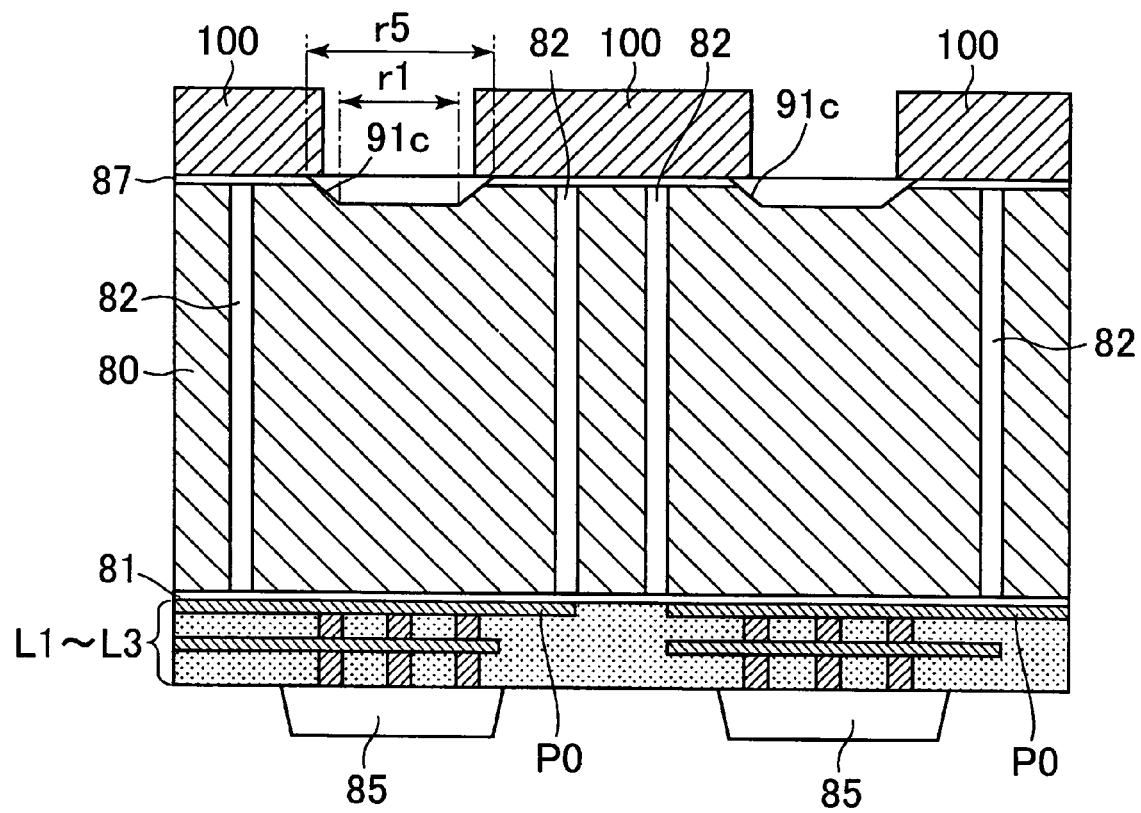
FIG. 20 is a process diagram for explaining the method of manufacturing the semiconductor device according to the modification of the present embodiment.

The through silicon via TSV shown in FIG. 19 can be formed by inserting a process shown in FIG. 20 between the process shown in FIG. 9 and the process shown in FIG. 10 in the manufacturing method described above. In the process shown in FIG. 20, the $SF_6$ gas is used as the etching gas, and etching is performed for a short time (for example, 60 seconds or shorter) with a bias power of 100W. With this etching process, as shown in FIG. 20, the notch 91c with the diameter r1 at the bottom being smaller than the diameter r5 at the opening edge is formed. By continuously performing the processes shown in FIGS. 10 to 18, the through silicon via TSV shown in FIG. 19 is completed.

As explained above, with the present manufacturing method, the semiconductor device 10 can be manufactured, which includes the through silicon via TSV including the bowing shaped portion 91a and the notches 91b and 91c.

While a preferred embodiment of the present invention has been explained above, the present invention is not limited to the above embodiment. Various modifications can be made without departing from the scope of the present invention, and it is needless to mention that these modifications are also included in the scope of the invention.

Figure 21:
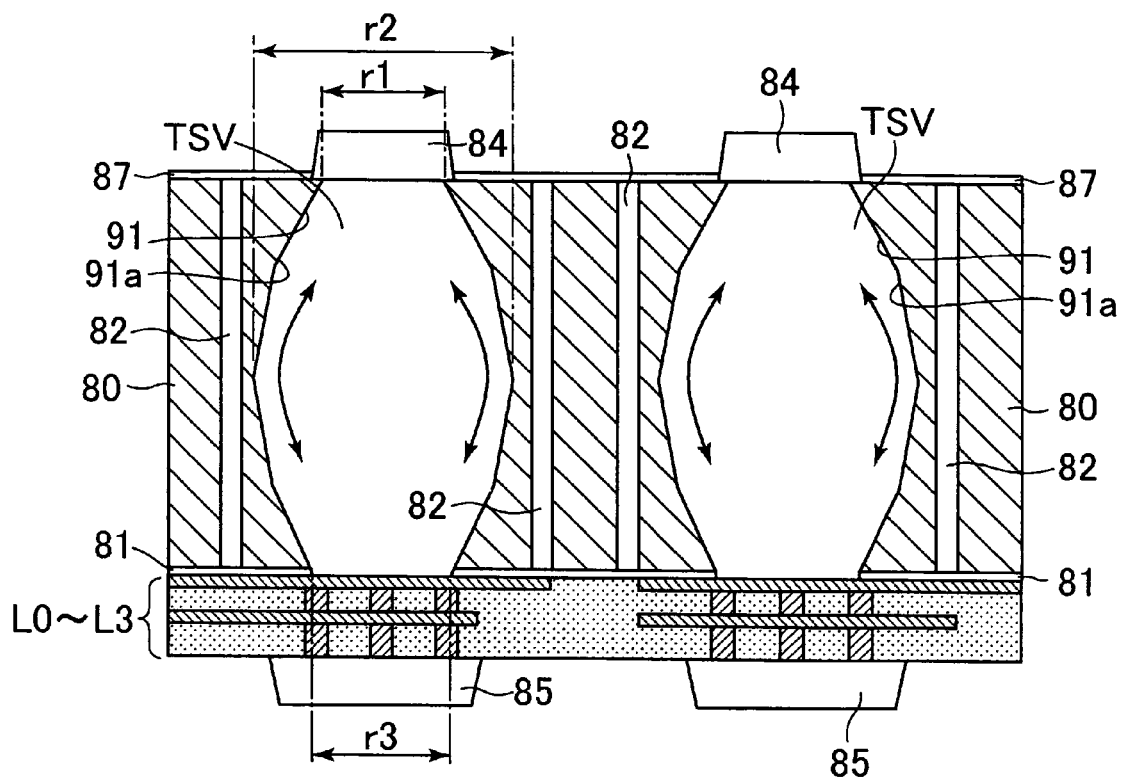
FIG. 21 is a schematic diagram showing a portion of a cross section of the semiconductor device according to a modification of the present embodiment, including cross sections of two through silicon vias arranged adjacent to each other on the same core chip.

For example, in the above embodiment, an example the via hole including both the bowing shaped portion and the notch. However, it also suffices that the via hole include either the bowing shaped portion or the notch, as a modification shown in FIG. 21 (an example of the via hole including only the bowing shaped portion without including the notch). Furthermore, it suffices that r2<r1 and r3 in the example shown in FIG. 21. In this case, the via hole has a shape in which the center portion is bulged toward the inner side. That is, by providing a portion in which the diameters of both edges and the diameter of the center portion are different from each other in the via hole, the through silicon via TSV is prevented from falling out of the semiconductor substrate 80 as shown in FIGS. 4 to 6.

Furthermore, in the above embodiment, a DDR3 SDRAM is used as the core chip. However, the present invention is not limited thereto, and the core chip can be a DRAM other than a DDR3 DRAM, or a semiconductor memory (such as an SRAM, a PRAM, an MRAM, or a flash memory) other than a DRAM. Moreover, the core chip can be a semiconductor device other than a semiconductor memory, such as a logic semiconductor device (a CPU or an ASIC). In addition, it is not essential that all the core chips are arranged in a layered manner, but a part or the whole of the core chip can be arranged in a planar configuration. Further, the number of the core chips is not limited to eight.

Finally, an overall configuration of the semiconductor device 10 is explained.

Figure 22:
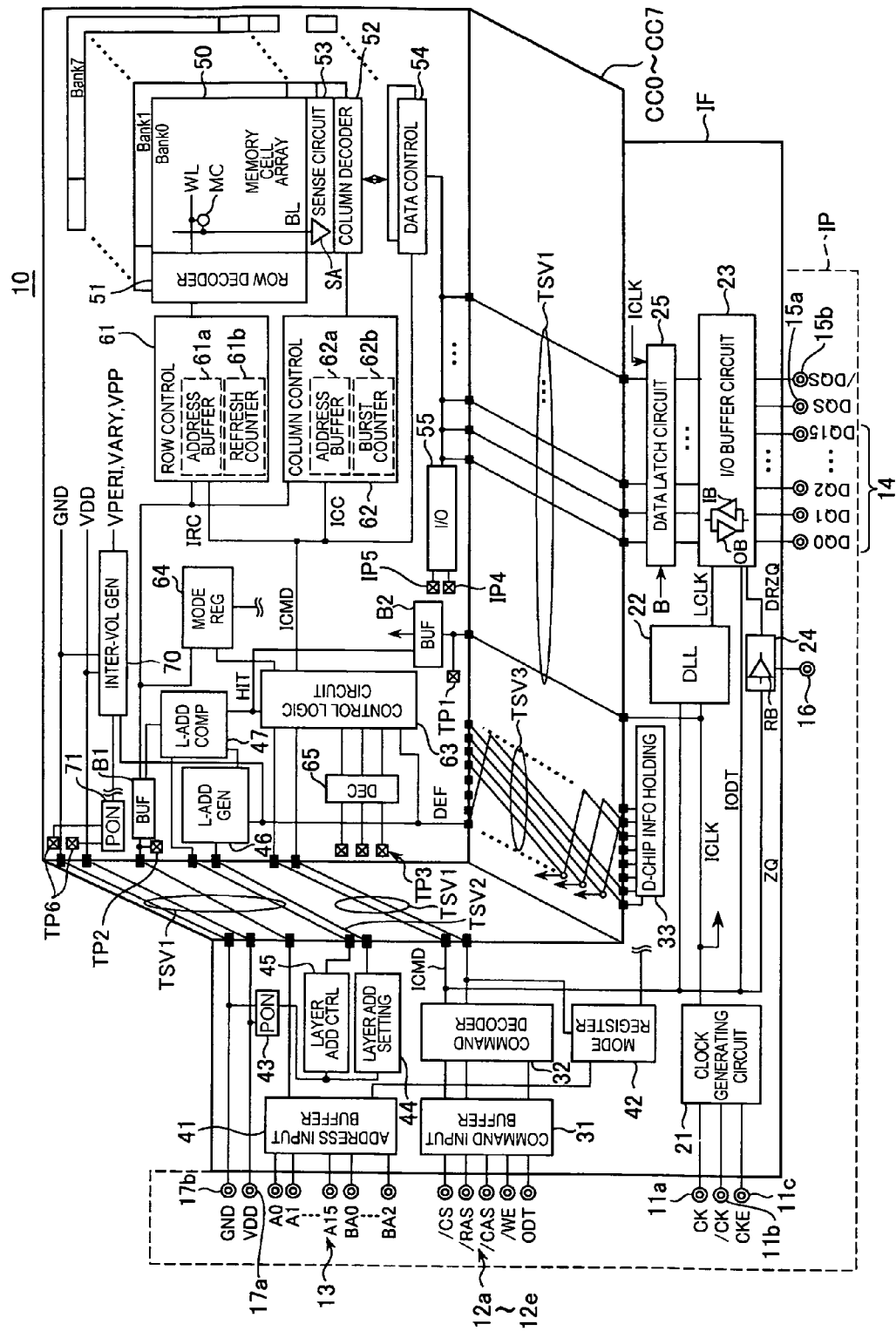
FIG. 22 is a block diagram illustrating the circuit configuration of the semiconductor memory device according to the preferred embodiment.

FIG. 22 is a block diagram illustrating the circuit configuration of the semiconductor memory device 10.

As shown in FIG. 22, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the through silicon vias TSV.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the through silicon vias TSV. The address signals A0 to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon vias TSV that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the through silicon vias TSV. The power-on detecting circuit 43 detects the supply of power. On detecting the supply of power, the power-on detecting circuit activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the through silicon vias TSV.

The interface chip IF is also provided with a layer address setting circuit 44. The layer address setting circuit 44 is connected to the core chips CC0 to CC7 through the through silicon vias TSV. The layer address setting circuit 44 is cascade-connected to the layer address generating circuit 46 of the core chips CC0 to CC7 using the through silicon via TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the through silicon vias TSV. The defective chip information holding circuit 33 is connected to the core chips CC0 to CC7 while being shifted, using the through silicon via TSV3 of the type shown in FIG. 2C.

The above description is the outline of the connection relationship between the external terminals and the interface chip IF and the circuit configuration of the interface chip IF. Next, the circuit configuration of the core chips CC0 to CC7 will be described.

As shown in FIG. 22, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the banks shares the external terminals (for example, plural control terminals and plural I/O terminals) of the semiconductor memory device 10. In the memory cell array 50, the plural word lines WL and the plural bit lines BL intersect each other, and memory cells MC are disposed at intersections thereof (in FIG. 22, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the through silicon via TSV, and the row address that is buffered by the address buffer 61a is supplied to the row decoder 51. The address signal that is supplied through the through silicon via TSV is supplied to the row control circuit 61 through the input buffer Bl. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the through silicon via TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through a some amplifier (a data amplifier and a sub-amplifier etc.) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the through silicon via TSV.

The control logic circuit 63 receives an internal command ICMD supplied from the interface chip IF through the through silicon via TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the through silicon via TSV and a layer address LID (chip identification information) set to the layer address generating circuit 46.

In the layer address generating circuit 46, unique layer addresses are set to the core chips CC0 to CC7, respectively, at initialization. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias TSV of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the through silicon via. TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the through silicon via TSV. As the defective chip signal DEF is supplied to the individual core chips CC0 to CC7 using the through silicon via TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the through silicon via TSV. The internal clock signal ICLK supplied through the through silicon via TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal, test data, or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

The kind of the test pads TP is nearly identical to those of the relay terminals provided the interposer IP. In particular, the test pads TP include a test pad TP1 supplied with the clock signal, a test pad TP2 supplied with the address signal, test pads TP3 supplied with the command signal, a test pad TP4 for performing input/output of test data, a test pad TP5 for performing input/output of data strobe signal, test pads 6 for supplying power-supply voltages.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 Gb are laminated, the semiconductor memory device 10 has a memory capacity of 8 Gb in total. Because the chip selection signal /CS is input to one terminal (chip selection terminal), the semiconductor memory device is recognized as a single DRAM having the memory capacity of 8 Gb, in view of the controller.

Figure 23:
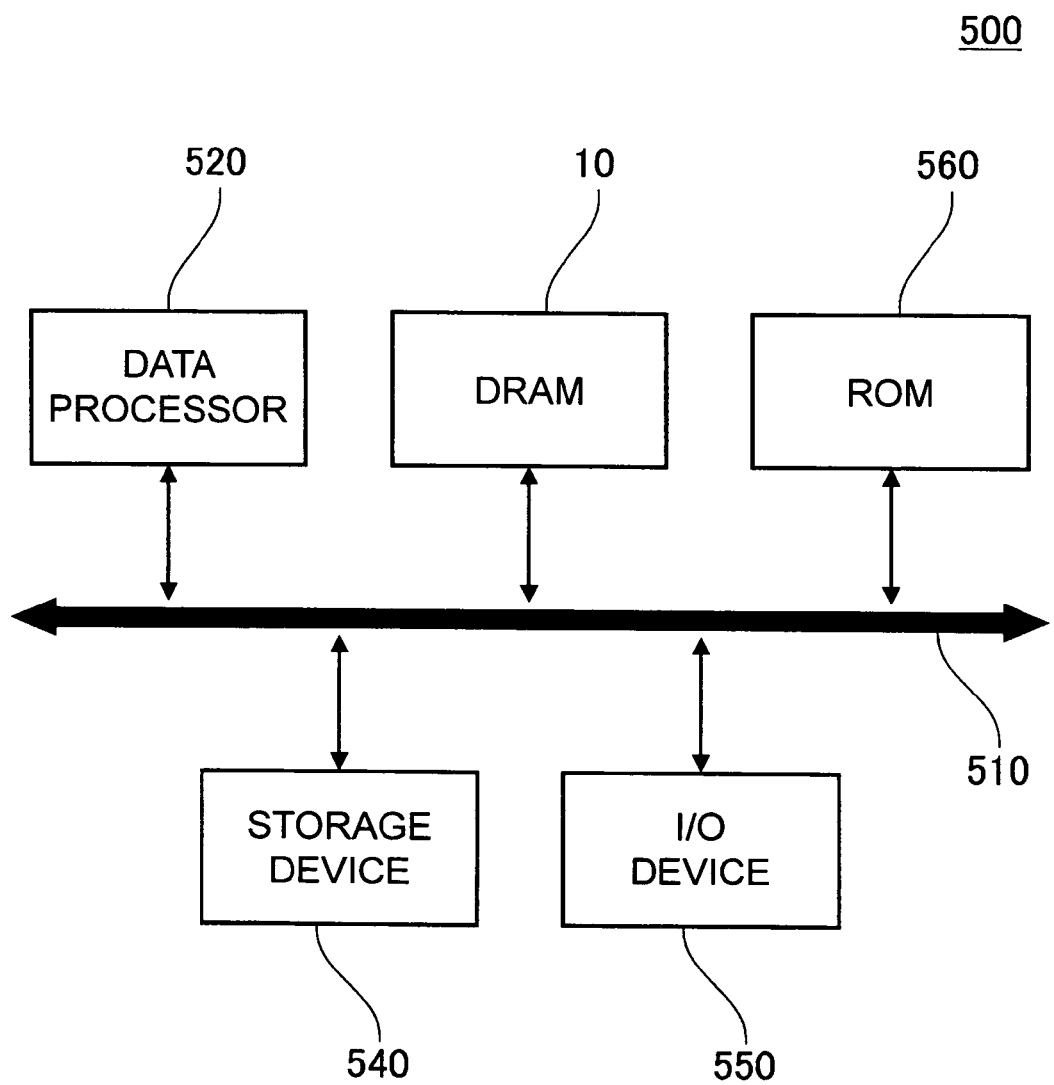
FIG. 23 is a block diagram showing the configuration of a data processing system using the semiconductor memory device according to the preferred embodiment.

FIG. 23 is a block diagram showing the configuration of a data processing system 500 using the semiconductor memory device 10 according to this embodiment.

The data processing system 500 shown in FIG. 23 has a configuration in which a data processor 520 and the semiconductor device (DRAM) 10 according to this embodiment is mutually connected via a system bus 510. The data processor 520, for example, includes micro-processor (MPU) or digital signal processor (DSP). But it is not limited to them. In FIG. 23, for the sake of shorthand, the data processor 520 and the DRAM 10 are connected via the system bus 510. But they may be connected using a local bus not via the system bus 510.

In FIG. 23, for the sake of shorthand, only one set of the system bus 510 is drawn. But a plurality of system buses 510 may be provided in serial or parallel manner via some connectors etc., if needed. In the data processing system 500 shown in FIG. 13, a storage device 540, I/O device 550, and ROM 560 are also connected to the system bus 510. But these components are not in dispensable.

The storage device 540 may be a hard disk drive, an optical disk drive, or a flash memory. The I/O device 550 may be one or more display devices such as a liquid display, but not limited to, or one or more input devices such as a keyboard, a mouse, but not limited to.

I/O device 550 can be only one of the input device and the output device.

Though only one component is drawn for each of the components shown in FIG. 23, the number of each of the components is not limited to one. The data processing system 500 can include a plurality of each of the components.

What is claimed is:

1. A semiconductor device comprising:
   a substrate including first and second surfaces and a via hole, the via hole being elongated in a first direction to penetrate the substrate from the first surface to the second surface; and
   an electrode provided in the via hole and including a first portion that comprises first and second end parts and a center part sandwiched between the first and second end parts, the first and second end parts and the center part being arranged along the first direction, and the first and second end parts being different in diameter from the center part, wherein
   the electrode further includes a second portion located between the first portion and the first surface of the substrate,
   the second portion includes a third end part exposed from the first surface of the substrate and a fourth end part connected to the first end part of the first portion,
   the third end part is larger in diameter than the first and fourth end parts, and
   the first and second end parts of the first portion of the electrode are smaller in diameter than the center part of the first portion of the electrode.

2. The semiconductor device as claimed in claim 1, wherein
   the electrode further includes a third portion located between the first portion and the second surface of the substrate,
   the third portion includes a fifth end part exposed from the second surface of the substrate and a sixth end part connected to the second end part of the first portion, and
   the fifth end part is larger in diameter than the second and sixth end parts.

3. The semiconductor device as claimed in claim 1, further comprising:

a plurality of core chips each including the substrate and the electrode; and an interface chip that is electrically connected to the core chips through the electrode of each of the core chips.

4. The semiconductor device as claimed in claim 1, further comprising:

a first interlayer insulating film on the first surface of the substrate; and a second interlayer insulating film on the second surface of the substrate, wherein the via hole penetrates the first and second interlayer insulating films.

5. The semiconductor device as claimed in claim 4, wherein the electrode is connected to a wiring layer on the first interlayer insulating film.

6. The semiconductor device as claimed in claim 1, further comprising:

an insulating ring around the electrode.

7. The semiconductor device as claimed in claim 5, further comprising:

a first bump formed on the wiring layer;

a second bump fanned on the second end part of the electrode; and a plurality of core chips each including the first and second bumps, wherein at least one of the first bump of the core chips is coupled with one of the second bump of the core chips.

8. A semiconductor device comprising:

a substrate including first and second surfaces and a via hole, the via hole being elongated in a first direction to penetrate from the first surface to the second surface and having a first side coupling structure which is formed on a side wall of the via hole;

an electrode provided in the via hole and including a first portion that comprises first and second end parts and a center part sandwiched between the first and second end parts, the electrode having a second side coupling structure which is formed on a side wall of the electrode, the center part being arranged along the first direction, wherein the first side coupling structure is coupled with the second side coupling structure, wherein the electrode further includes a second portion located between the first portion and the first surface of the substrate, wherein the second portion includes a third end part exposed from the first surface of the substrate and a fourth end part connected to the first end part of the first portion, wherein the second side coupling structure is formed in the second portion, wherein the third end part is larger in diameter than the first and fourth end parts, and wherein the first and fourth end parts are smaller in diameter than at least a part of the center part of the first portion of the electrode.

9. The semiconductor device as claimed in claim 8, wherein the second side coupling structure is formed in the center part, and the first and second end parts of the first portion of the electrode are smaller in diameter than the center part of the first portion of the electrode.

10. The semiconductor device as claimed in claim 8, wherein the second side coupling structure is formed in the center part, and the first and second end parts of the first portion of the electrode are smaller in diameter than at least a part of the center part of the first portion of the electrode.

11. The semiconductor device as claimed in claim 8, wherein the electrode further includes a third portion located between the first portion and the second surface of the substrate, the third portion includes a fifth end part exposed from the second surface of the substrate and a sixth end part connected to the second end part of the first portion, the second side coupling structure is formed in the third portion, the fifth end part is larger in diameter than the second and sixth end parts, and the second and sixth end parts are smaller in diameter than at least a part of the center part of the first portion of the electrode.

12. The semiconductor device as claimed in claim 8, wherein the via hole further has a third side coupling structure which is formed on a side wall of the via hole, the electrode further has a fourth side coupling structure which is formed on a side wall of the electrode, the third side coupling structure is coupled with the fourth side coupling structure, the electrode further includes a third portion located between the first portion and the second surface of the substrate, the third portion includes a fifth end part exposed from the second surface of the substrate and a sixth end part connected to the second end part of the first portion, the fourth side coupling structure is formed in the third portion, the fifth end part is larger in diameter than the second and sixth end parts, and the second and sixth end parts are smaller in diameter than at least a part of the center part of the first portion of the electrode.

13. The semiconductor device as claimed in claim 8, wherein the electrode further includes a third portion located between the first portion and the second surface of the substrate, wherein the third portion includes a fifth end part exposed from the second surface of the substrate and a sixth end part connected to the second end part of the first portion, wherein the electrode has two of the second side coupling structures, one of the second side coupling structures is formed in the second portion and an other of the second side coupling structures is formed in the third portion, and wherein the fifth end part is larger in diameter than the second and sixth end parts.

14. The semiconductor device as claimed in claim 8, further comprising:

a plurality of core chips each including the substrate and the electrode; and an interface chip that is electrically connected to the core chips through the electrode of each of the core chips.

15. The semiconductor device as claimed in claim 8, further comprising:

a first interlayer insulating film on the first surface of the substrate; and a second interlayer insulating film on the second surface of the substrate, wherein the via hole penetrates the first and second interlayer insulating films.

16. The semiconductor device as claimed in claim 8, wherein
- the first side coupling structure includes one of a first protrusive portion and a first concave portion toward the via hole, and
- the second side coupling structure includes one of a second concave portion and a second protrusive portion toward the substrate.

17. A semiconductor device, comprising:
- a substrate including first and second surfaces and a bowing shaped via hole, the bowing shaped via hole being elongated in a first direction to penetrate from the first surface to the second surface and having a first side coupling structure which is formed on a side wall of the bowing shaped via hole;
- an electrode provided in the via hole and including a first portion that comprises first and second end parts and a center part sandwiched between the first and second end parts, the electrode having a second side coupling structure which is formed on a side wall of the electrode, and the center part being arranged along the first direction,
- wherein the first side coupling structure is coupled with the second side coupling structure,
- wherein the electrode further includes a second portion located between the first portion and the first surface of the substrate,
- wherein the second portion includes a third end part exposed from the first surface of the substrate and a fourth end part connected to the first end part of the first portion,
- wherein the second side coupling structure is formed in the second portion,
- wherein the third end part is larger in diameter than the first and fourth end parts, and
- wherein the first and fourth end parts are smaller in diameter than at least a part of the center part of the first portion of the electrode.

18. The semiconductor device as claimed in claim 17, wherein
- the electrode further includes a third portion located between the first portion and the second surface of the substrate,
- the third portion includes a fifth end part exposed from the second surface of the substrate and a sixth end part connected to the second end part of the first portion,
- the second side coupling structure is formed in the third portion, the fifth end part is larger in diameter than the second and sixth end parts, and
- the second and sixth end parts are smaller in diameter than at least a part of the center part of the first portion of the electrode.

* * * * *